United States Patent
Brodine

(10) Patent No.: US 6,413,037 B1
(45) Date of Patent: Jul. 2, 2002

(54) FLEXIBLY MOUNTED CONTACT CUP

(75) Inventor: Jeffrey A. Brodine, Los Gatos, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/524,991

(22) Filed: Mar. 14, 2000

(51) Int. Cl.⁷ .............................................. B65G 49/07
(52) U.S. Cl. ..................... 414/941; 414/935; 294/64.1; 901/40
(58) Field of Search .................. 271/11, 107; 294/64.1; 901/40; 414/939, 941, 935, 754

(56) References Cited

U.S. PATENT DOCUMENTS

| | | | | |
|---|---|---|---|---|
| 2,557,260 A | * | 6/1951 | Clark | 294/64.1 |
| 5,582,450 A | * | 12/1996 | Nagai et al. | 294/64.1 |
| 5,765,444 A | * | 6/1998 | Bacchi et al. | 901/40 |
| 5,879,040 A | * | 3/1999 | Nagai et al. | 294/64.1 |
| 5,902,088 A | * | 5/1999 | Fairbairn et al. | 414/939 |
| 5,935,330 A | * | 8/1999 | Taniguchi | 414/941 |
| 6,003,863 A | * | 12/1999 | Barringer et al. | 271/11 |
| 6,024,526 A | * | 2/2000 | Slocum et al. | 901/40 |
| 6,162,010 A | * | 12/2000 | Ishizawa et al. | 414/939 |
| 6,183,026 B1 | * | 2/2001 | Cai et al. | 294/64.1 |
| 6,254,155 B1 | * | 7/2001 | Kassir | 294/64.1 |

FOREIGN PATENT DOCUMENTS

SU 0994243 * 2/1983 ................ 294/64.1

* cited by examiner

*Primary Examiner*—H. Grant Skaggs
(74) *Attorney, Agent, or Firm*—Moser, Patterson & Sheridan LLP

(57) ABSTRACT

The present invention provides a robot blade for supporting substrates in a processing system. More particularly, the invention provides a blade comprising a contact cup flexibly attached thereto to compensate for inaccurate alignment between the blade and a substrate and allow accurate alignment and flush contact between the contact cup and a substrate. The substrate can then be reliably secured to the blade when retrieved from a face-down position, with the blade positioned above the substrate.

22 Claims, 7 Drawing Sheets

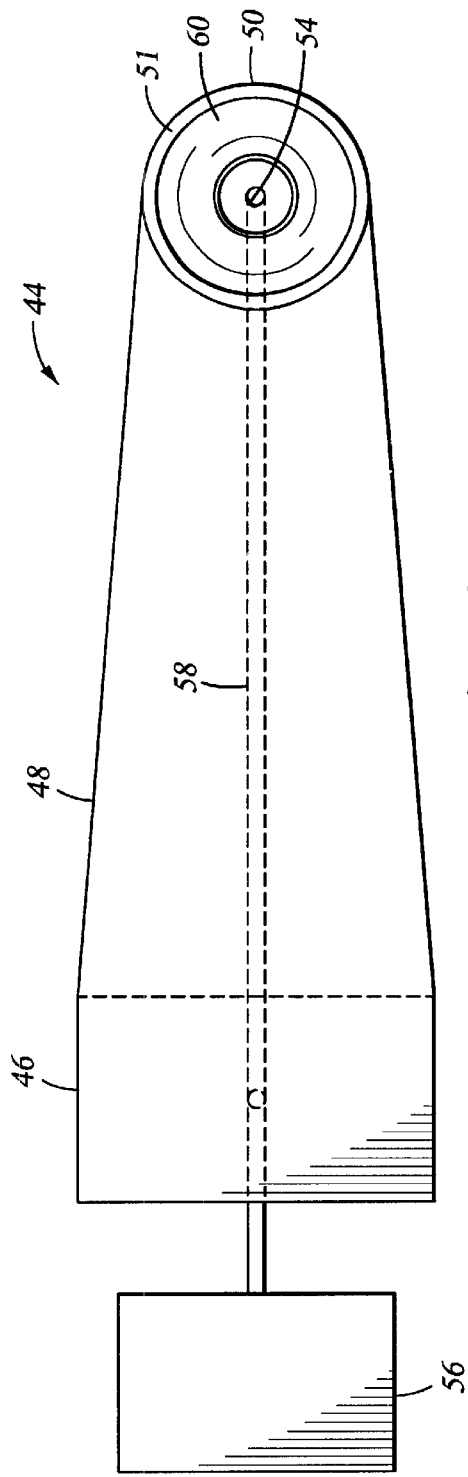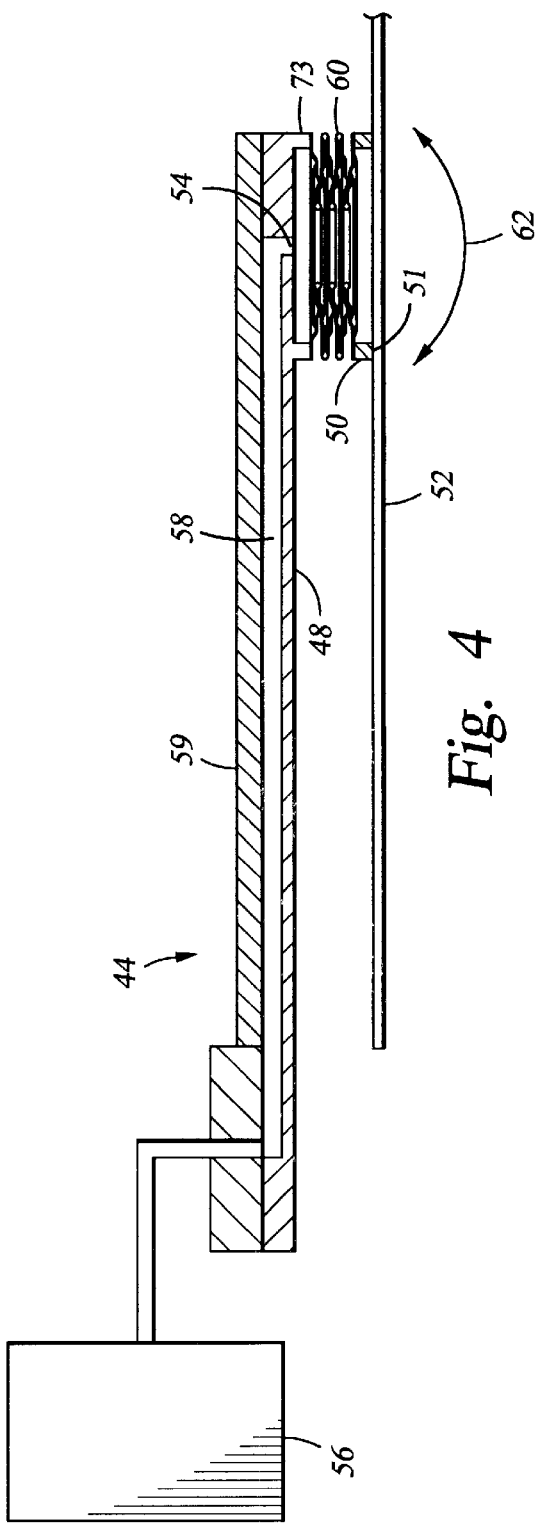
Fig. 3
Fig. 4

FLEXIBLY MOUNTED CONTACT CUP

BACKGROUND OF THE INVENTION

1. Field of the Invention

The present invention relates to an apparatus and method for handling substrates in a processing system and more particularly to a contact cup flexibly disposed on a substrate support blade.

2. Background of the Related Art

The advantages of using automated substrate handling devices, or robots, in the fabrication of integrated circuits to transfer substrates such as silicon wafers throughout a processing system are well established. Typically, cassettes containing substrates are moved through a semiconductor fabrication facility and delivered to various processing systems. One or more robots are located in a central transfer region and are capable of linear and/or rotational movement to retrieve substrates from the cassettes, shuttle them between various processing chambers within a multichamber processing system, and ultimately replace the processed substrates into the cassettes for removal from the system.

In many processing systems, substrates are processed in a face-up position, that is, with the processing surface of the substrate in a face-up position. Substrates are stored in cassettes, retrieved and shuttled between processing chambers, and finally replaced into the cassette while in a face-up position. A robot blade disposed at a distal end of a robot arm is positioned underneath the substrate to lift and transport the substrate within a system.

However, modem trends in semiconductor fabrication have led to processing systems wherein substrates are processed in a face-down position. For example, as feature sizes decrease and copper becomes a metal of choice, there is a trend to use electroplating systems to form metallized features on a substrate. Current designs of electroplating systems require face-down processing of substrates in electroplating cells. As a result, there is a need to flip substrates to a face-down position for processing in electroplating cells. After processing, substrates need to be flipped back to a face-up position for transfer to other processing cells and for replacement into substrate cassettes, etc.

To accomplish flipping of a substrate, the substrate is typically secured to the end portion of the robot arm, known as a blade, by vacuum chucking, which uses a vacuum to secure the substrate to a contact cup disposed blade. The blade has a contact cup disposed at a point of contact with the substrate. In vacuum chucking, a vacuum is applied to the volume defined between the contact cup and the substrate. The vacuum is sufficient to secure the substrate to the contact cup. After the substrate is vacuum chucked to the blade and removed from the cassette, the blade flips the substrate and positions the substrate face-down for delivery into an electroplating processing cell. After processing, the robot blade is positioned above the substrate and then lowered until the blade contacts the backside surface of the substrate. The process of attaching and retrieving a substrate that is in an inverted position is known as an inverted hand-off. The substrate is then vacuum chucked to the blade via the contact cup, lifted out of the processing cell, and again flipped for further face-up processing.

One problem encountered in transferring substrates within a processing system is that it is difficult to align the contact cup of the blade with the substrate when the substrate is in a face-down position so that the substrate can be vacuum chucked to the blade and lifted from the processing cell. Various factors can lead to inaccurate alignment between the blade and the substrate in complex processing systems, such as those used in semiconductor fabrication systems, including unreliable calibration of the robot and uncertainties as to station locations due to thermal expansion, etc. within the processing system. When substrates are transferred in a face-up position, as in typical traditional processing systems, the blade is positioned underneath the substrate so that gravity helps assure flush contact between the contact cup and a substrate. However, during an inverted handoff, where the blade is positioned above a face-down substrate, proper alignment for a sealed engagement between the contact cup and the substrate backside surface is more difficult to achieve. Accurate alignment is especially important in an inverted handoff to provide a good vacuum seal between the blade and the substrate for reliable vacuum chucking to enable the substrate to be lifted by the blade. Inaccurate alignment during an inverted hand-off can result in failed hand-offs, damaged substrates and reduced system throughput.

Therefore, there is a need for a robot that can reliably secure a substrate to a blade thereof.

SUMMARY OF THE INVENTION

The invention generally provides a robot blade for handling substrates in a processing system. In one aspect, a robot blade of the invention includes a contact cup is flexibly attached thereto to compensate for inaccurate alignment of the blade with a substrate and allow the contact cup to align with and come into flush contact with the substrate. This allows the substrate to be reliably secured to the blade when retrieved from a face-down position when the blade is positioned above the substrate.

In another aspect of the invention, a method of handling a substrate is provided, wherein the contact cup flexibly attached to the substrate support blade that contacts the substrate. The blade is lowered so that the contact surface of the contact cup contacts the backside of the face-down substrate and then the contact cup is vacuum chucked to the substrate via a vacuum created behind the backside of a substrate. As the contact sup comes into contact with the substrate, the contact cup deforms such that the entire contact surface contacts the substrate backside.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 3 is a plan view of one embodiment of a blade;

FIG. 4 is a side view of the FIG. 3 embodiment of a blade that illustrates a bellows flexibly attaching a paddle to a contact cup, the blade is configured for electrostatic chucking;

DETAILED DESCRIPTION OF THE PREFERRED EMBODIMENT

An apparatus and associated method for handling substrates with a robot in a processing system is now described. The robot has a blade including a contact cup which compensates for inaccurate alignment between a robot blade and a substrate. The contact cup is particularly useful in those processing systems in which a robot blade is secured to the substrate when the substrate is in its face down position. The substrate is in its face-down position when the blade is positioned above the backside of the substrate with the substrate inverted. Such face-down configurations are common in electroplating systems.

Figure 1:
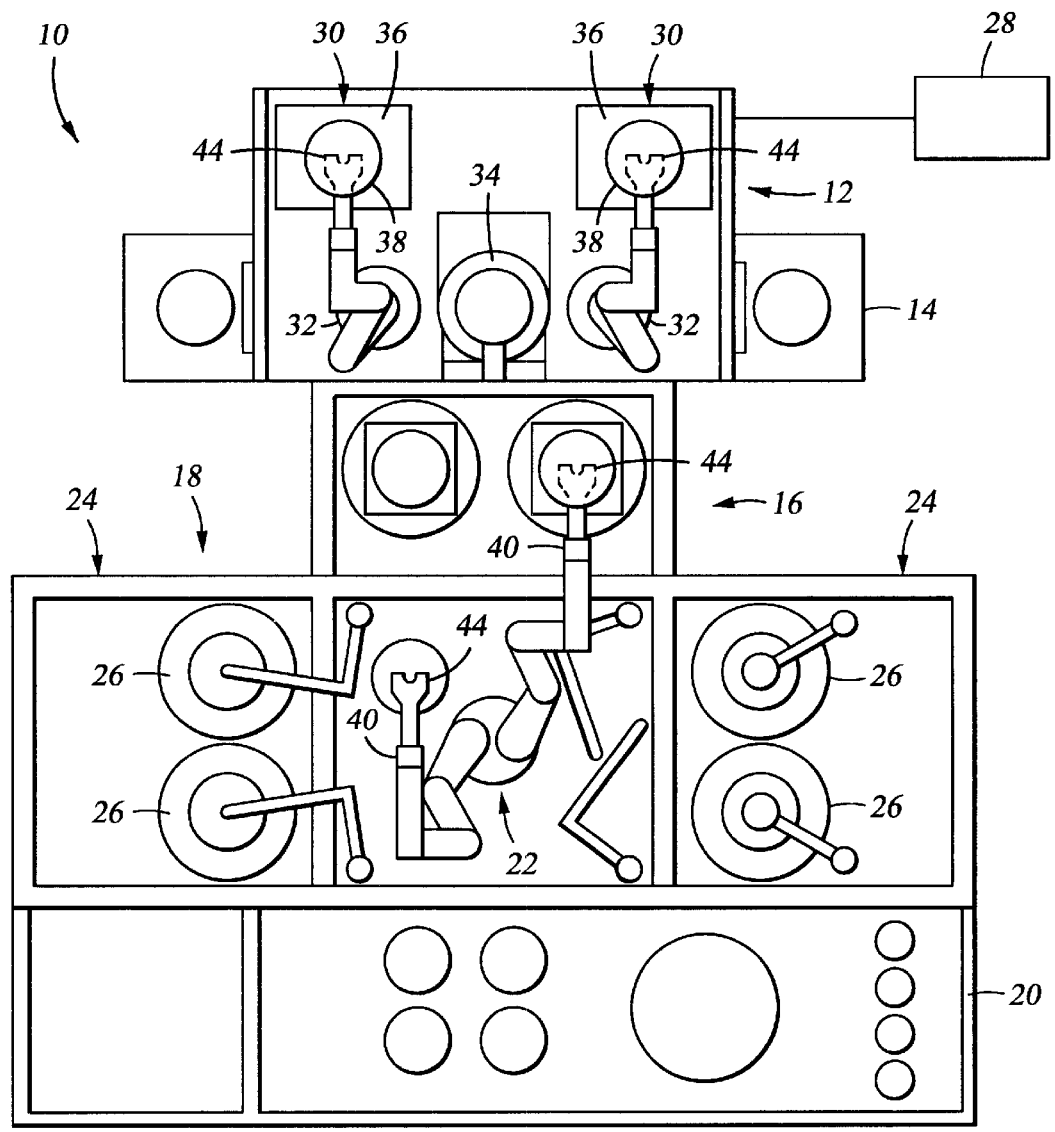
FIG. 1 is a top plan view of an electroplating system.

FIG. 1 is a top plan view of an electroplating system 10. Although an electroplating system 10 is specifically discussed, the invention is useful in any processing system where substrates are transferred while in a face-down position and/or in processing systems where substrates are inverted or "flipped". The electroplating system 10 generally comprises a loading station 12, a thermal anneal chamber 14, a spin-rinse-dry/pass through station 16, a mainframe 18, and an electrolyte replenishing system 20. The electroplating system 10 may be enclosed in a clean environment using panels such as Plexiglas panels. The mainframe 18 generally comprises a mainframe transfer robot 22 and a plurality of processing stations 24. Each processing station 24 includes one or more processing cells 26. An electrolyte replenishing system 20 is positioned adjacent to the mainframe 18 and connected to the processing cells 26 individually to circulate electrolyte used for the electroplating process. The electroplating system 10 also includes a control system 28 such as a programmable microprocessor.

The loading station 12 may include one or more wafer cassette receiving areas 30, one or more loading station transfer robots 32 and at least one wafer orientor 34. As shown in the embodiment in FIG. 1, the loading station 12 includes two wafer cassette receiving areas 30, two loading station transfer robots 32, and one wafer orientor 34. A wafer cassette 36 containing wafers 38 is loaded onto the wafer cassette receiving area 30 to introduce wafers 38 into the electroplating system 10. The wafer orientor 34 positions each wafer 38 in a desired orientation for placement by the loading station transfer robot 32 to ensure that the wafer 38 is properly aligned during processing. The loading station transfer robot 32 retrieves wafers 38 from and replaces wafers 38 in the wafer cassette 36 and also transfers wafers 38 between the loading station 12 and the spin-rinse-dry/pass through station 16 and between the loading station 12 and the thermal anneal chamber 14.

During the processing sequence, wafer cassettes 36 containing a plurality of wafers 38 are introduced into the wafer cassette receiving areas 30. Wafers 38 are positioned face-up on shelves in the cassettes 36. This face-up positioning allows wafers 38 to be transferred by blades 44 that are positioned under the wafer 38, avoiding unnecessary contact with the processed, top surface of the wafer 38. Wafers 38 can be flipped or inverted after being introduced into the system to position the processing surface face-down in a processing cell 26 and come in contact with the electrolyte during an electroplating process. The mainframe transfer robot 22 transfers wafers 38 between the processing cell 26 and other processing stations attached to the mainframe 18, such as the spin-rinse-dry/pass through station 16. The mainframe transfer robot 22 includes one or more robot arm 42 having an inversion mechanism 40 typically referred to as a "flipper robot", which is used to invert or flip the wafers 38 by inverting the blade 44 after a wafer 38 is secured to the blade 44. After the electroplating process, robot arms 42 having inversion mechanisms 40 may again invert the wafers 38, so that the processed sides of the wafers 38 face up, before the wafers 38 are farther processed in the spin-rinse-dry/pass through station 16 and the thermal anneal chamber 14, and ultimately placed back into the wafer cassette 36 for removal from the electroplating system 10.

Figure 2:
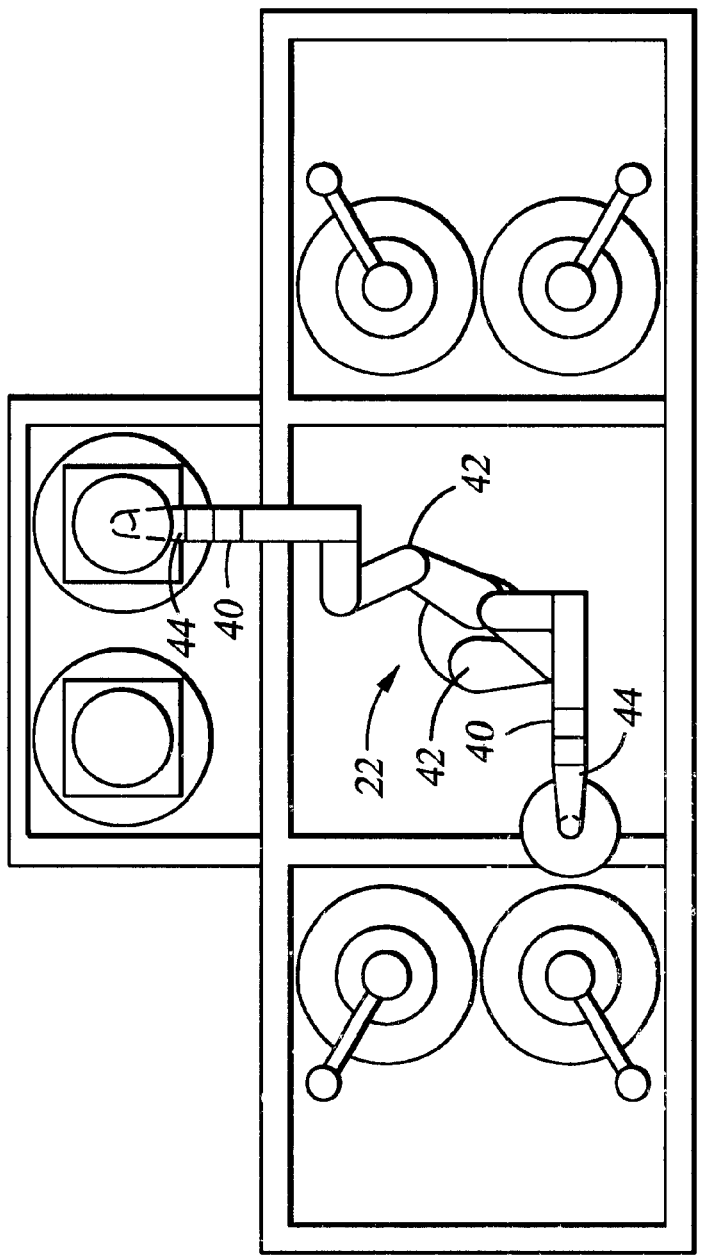
FIG. 2 is a plan view of a portion of an electroplating system and a robot system associated therewith.
Figure 2A:
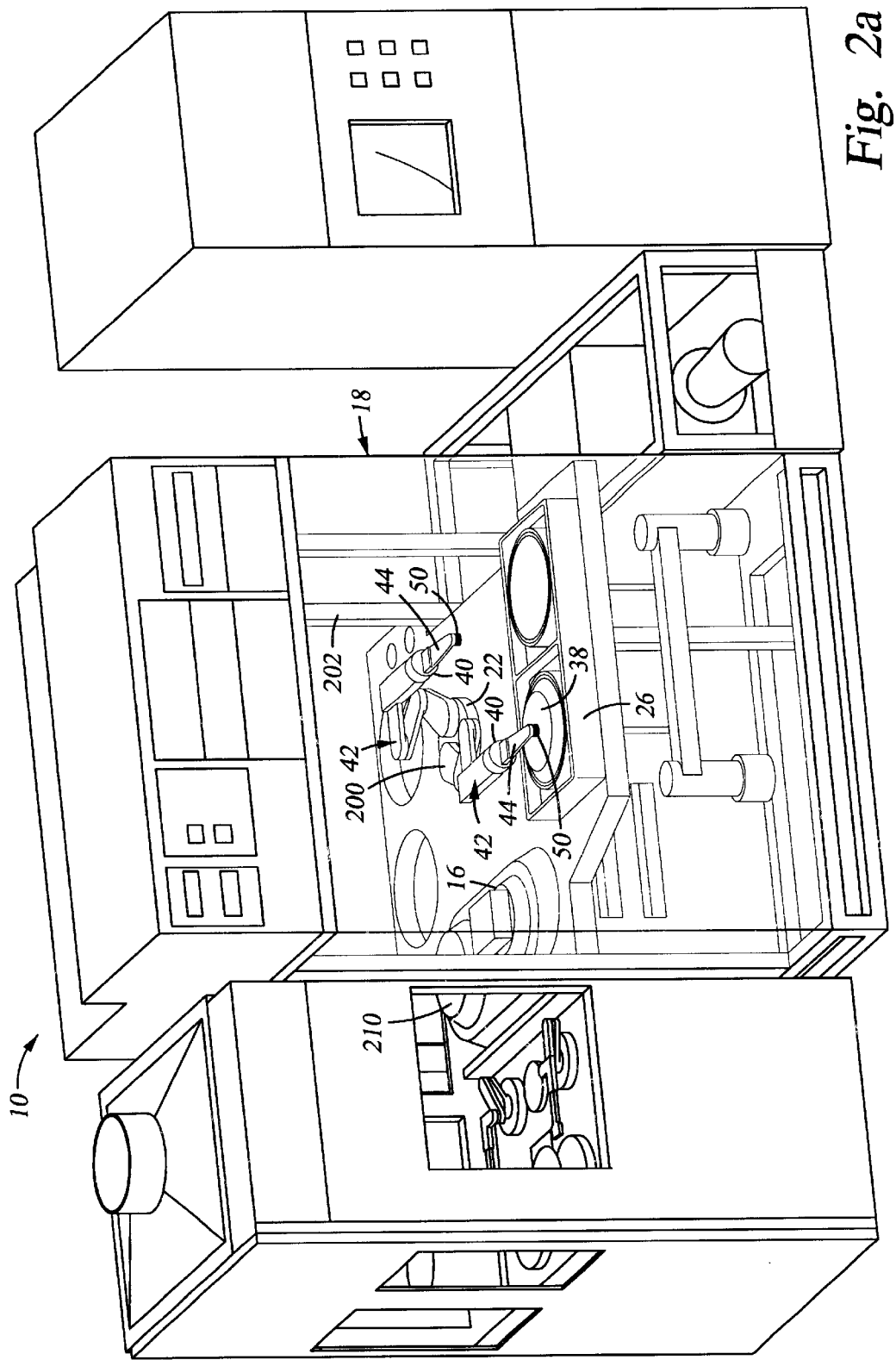
FIG. 2a is a perspective view of an electroplating system.

FIG. 2 is a plan view of a robot system used within an electroplating processing system. The robot system includes a mainframe transfer robot 22 having one or more robot arms. Each robot arm 42 includes an inversion mechanism 40 that inverts the robot blade 44. An inversion mechanism is disposed at the distal end of each robot arm 42. Each inversion mechanism can be actuated to rotate the blade 44 about its longitudinal, substantially horizontal axis. The robot system includes a mainframe transfer robot 22, one or more of the robot arms 42, each having an inversion mechanism 40. FIG. 2a is a perspective view of an electroplating system 10. The mainframe transfer robot 22 serves to transfer wafers 38 between different stations attached to the mainframe 18. In the embodiment shown, each of two robot arms 42 extends from a central hub 200 disposed on the mainframe 18. Each hub 200 can be actuated to rotate, enabling each robot arm 42 to rotate about a vertical axis 202 of the mainframe 18. Each hub 200 can also be actuated to move vertically up or down, thus enabling each robot arm 42 to move vertically. Each robot arm 42 includes a plurality of rigid segments 204 connected to each other at pivot joints 208, enabling each robot arm 42 to extend and retract in a horizontal plane.

During an electroplating processing sequence, a robot arm 42 of the mainframe transfer robot 22 is actuated to pick up a wafer 38 positioned face-up in a wafer pass-through cassette 210 of the spin-rinse-dry/pass through station 16. The robot arm 42 moves so that the blade 44 thereof is positioned under a face-up wafer 38, and then the wafer 38 is vacuum chucked to the contact cup 50 of the blade 44. The robot arm 42 lifts the wafer 38 from the wafer pass-through cassette 210 and transfers the wafer 38 to a position above a processing cell 26, with the wafer 38 still in a face-up position on top of the blade 44, as shown in FIG. 2a. The inversion mechanism 40 of the robot arm 42 then actuates to rotate the blade 44, flipping or inverting the wafer 38 so that the wafer 38 is positioned face-down over the processing cell 26, with the wafer 38 still vacuum chucked to the contact cup 50 of the blade 44. The robot arm 42 then places the wafer 38 face-down into the processing cell 26 for electroplating processing. After processing, the robot arm 42 performs an inverted hand-off, lifting the face-down wafer 38 from the processing cell 26 and transferring the wafer 38 for further processing in the spin-rinse-dry station 16 and the thermal anneal chamber 14. The details of the inverted hand-off are shown and described in later Figures.

FIG. 3 is a plan view of a blade 44 of the invention. The blade 44 comprises a base 46 having a paddle 48 extending therefrom. The paddle 48 and the base 46 may be a unitary structure or the paddle 48 could be connected to the base 46 by fasteners such as screws. The blade 44 may be made of materials such as stainless steel, plated aluminum, or a static dissipative ceramic material. The base 46 is mounted to a robot arm 42 using screws or other fasteners.

The contact cup 50 is secured to a contact surface 51 defined on the end of the paddle 48. Welding, suitable adhesives, or connectors such as screws or nuts and bolts may be used to attach the contact cup 50 to the contact surface 51. The contact cup 50 may be made of metal such as stainless steel or aluminum, a static dissipative phenolic material, or an elastomeric material. The contact cup 50 may be circular, as shown in the embodiment of FIG. 3, or any shape (such as oval or rectangular in horizontal cross section) useful to secure a substrate 52 thereto. The contact cup 50 is disposed around one or more evacuation ports 54, as shown in FIG. 3. The contact cup 50 is connected to the paddle 48 via a flexible connector such as a bellows 60 as shown in FIGS. 4 and FIGS. 6–8. A sealed vacuum channel 58 is formed at least partially within the base 46 and the paddle 48 and is in fluid communication with a vacuum source 56 and the evacuation port 54.

FIG. 4 is a side view of a blade 44 of the invention. The bellows is flexible, and attaches to form a seal between the contact cup 50 and the paddle 48. The bellows 60 can be sealed and attached to the blade 44 and the contact cup 50 by various methods, including bonding and welding. The bellows 60 provides flexible movement of the contact cup 50 about a given horizontal axis relative to the blade 44 as shown by double-headed arrow 62. The bellows 60 is preferably made of stainless steel, plastic or Inconel. A sealed vacuum channel 58 extends through the blade 44 in fluid communication with the vacuum source 56 and the evacuation ports 54. The vacuum channel 58 may be formed by forming a channel along the length of the paddle 48. A backing plate 59 is provided to define (in combination with the upper surface of the paddle) an outer periphery of the vacuum channel 58. The bellows 60 is mounted to extend around one or more of the evacuation ports 54 defined in the paddle 48. A connecting element 73 secures the bellows 60 to the blade 44 about the periphery of the bellows 60. The connecting element 73 may be a plastic, elastomeric, or metal member that secures the bellows 60 to the blade 44 using an adhesive, a weld, or a mechanical connector such as screws and/or bolts. The connecting element 73 must form a sealing connection between the bellows 60 and the blade 44 about the periphery of the bellows. This sealing connection must be sufficient to withstand the vacuum to be applied to within the bellows 60 during the vacuum chucking process.

Figure 5:
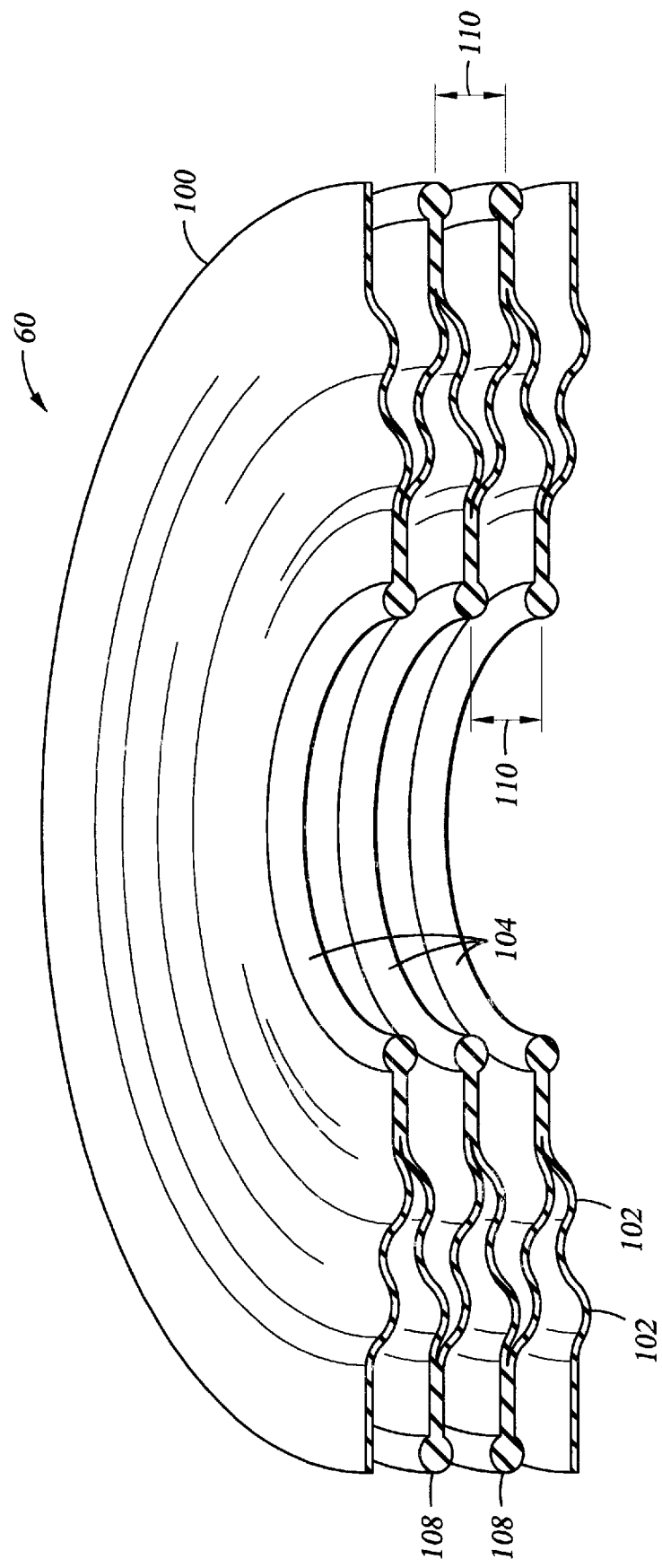
FIG. 5 is a cut-out perspective view of a portion of a bellows.

FIG. 5 is a cut-out perspective view of a portion of one embodiment of a bellows 60 that could be used in the present invention. The bellows generally includes a plurality of thin stainless steel rings 100 (six are shown, though more or less may be used). Each ring 100 is welded to the adjacent ring 100 about either an inner circumference 104 or an outer circumference 108. The connections to the inner circumference 104 alternate with connections to the outer circumference 108 for each pair of adjacent stainless steel rings 100. The surface of each ring 100 has a plurality of concentric annular grooves 102 which provide rigidity and stability (especially in the lateral direction) to the bellows 60. The concentric annular grooves 102 are optional. A complete bellows may have a total of fourteen to twenty rings 100. Metal bellows of this type are available from manufacturers such as Belfab, Inc., of Daytona Beach, Florida, and Flexonics, Inc., of Sharon, Massachusetts. In operation, as the bellows 60 compresses, adjacent rings 100 come closer together, so that the gaps 110 (two are shown) between adjacent metal rings 100 decrease in height.

While the contact cup 50 is attached to the blade 44 by a bellows 60 in the preferred embodiment to provide flexibility between the contact cup 50 and the blade 44. For example, one embodiment of the flexible material that can be used to form the bellow from is as elastomeric or a synthetic rubber material. The bellows may also be formed from a somewhat flexible metallic material. A metal bellows may be more resistant to material deposition and corrosion than some other means of flexible attachment. The bellows 60 is disposed between the contact cup 50 and the blade 44. Although flexible attachment by means other than a bellows 60 are contemplated by the invention, attachment by a metal bellows may have certain advantages over other means of attachment.

Figure 6:
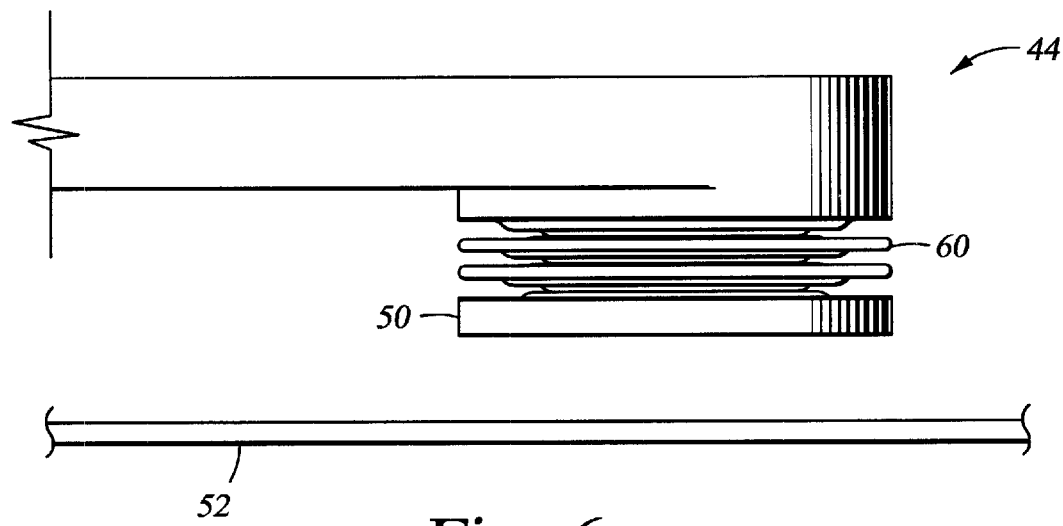
FIG. 6 is a side view of a blade illustrating a bellows and contact cup in an extended position over a substrate.
Figure 7:
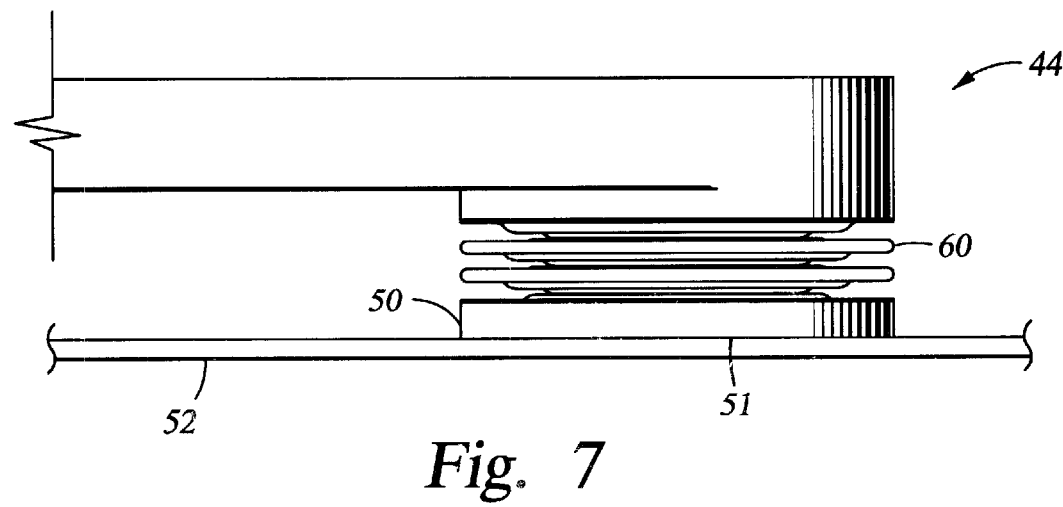
FIG. 7 is a side view of a blade illustrating a bellows and contact cup in an extended position contacting a substrate.
Figure 8:
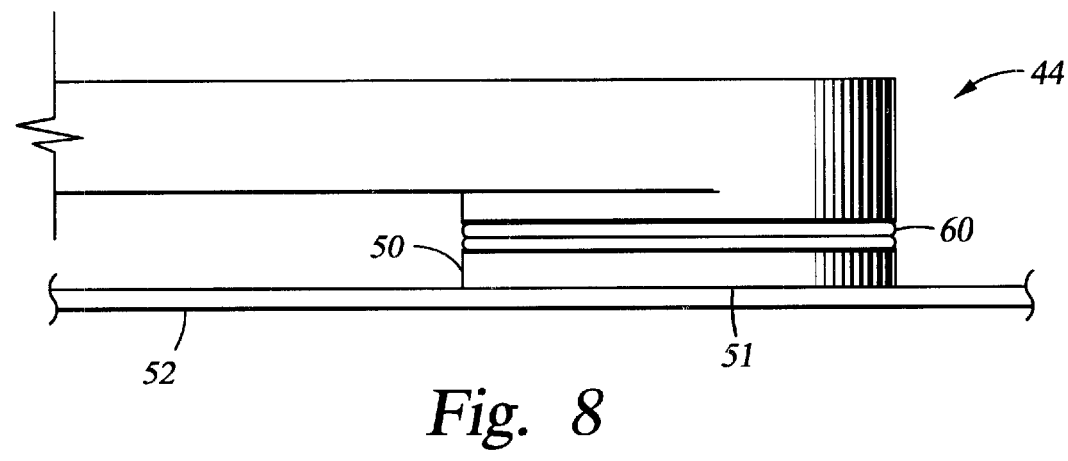
FIG. 8 is a side view of a blade illustrating a bellows in a compressed position with a substrate mounted on a contact cup.

The present invention is particularly useful in performing inverted hand-offs. FIGS. 6 through 8 show a side view of a blade undergoing the inverted hand-off sequence. In this sequence, the blade 44 is flexibly attached to the backside of an inverted substrate by the contact cup 50. The bellows 60 provide the flexibility for the contact cup to make this coupling.

FIG. 6 shows the first step of the sequence, and illustrates a contact cup having an extended bellows 60 positioned over a substrate 52. A robot arm 42 including the blade 44 is being moved downwardly such that the blade 44 (including the contact cup 50) is positioned a short distance above the surface of the substrate 52. The substrate is in a face-down position.

FIG. 7 shows the second step of the sequence and illustrates a contact cup 50 (that is still in the extended position) when the contact cup 50 initially contacts the backside of the inverted substrate 52. A robot arm is further actuated to lower the blade 44 into a position such that the bellows 60 incrementally compresses as the contact cup 50 continues to be lowered.

FIG. 8 shows the final step of the sequence and illustrates the contact cup 50 in its fully compressed state such that bellows 60 are compressed position. Once the contact surface 51 of the contact cup 50 initially contacts the substrate 52 as shown in FIG. 7, a vacuum can be generated by a vacuum generator to apply a vacuum via the vacuum channel to the volume between the substrate 52 and the contact cup 50. A vacuum is sufficient to secure the substrate 52 to the contact cup 50. The vacuum tends to collapse the bellows 60 and the contact cup 50 into their compressed states. As the contact cup compresses, the substrate 52 is displaced relative to the blade 44 from the position shown in FIG. 7 to the position shown in FIG. 8. The substrate 52 can now be moved while in the face-down position, or it can be inverted.

During the inverted handoff, the blade 44 is lowered until the contact cup 50 contacts the substrate 52. The flexibility of the bellows 60 allows the contact surface 51 of the contact cup 50 to come into flush contact with the substrate 52, compensating for inaccurate alignment between the paddle 48 of the blade 44 and the substrate 52 by allowing gravity to cause the contact surface 51 of the contact cup 50 to align with the substrate 52. The flexibility of the contact surface 51 (that is formed from such a flexible material as an elastomeric or synthetic rubber) enables the contact surface to deform to slight irregularities in the upper surface of the substrate, and thereby the contact cup 50 can contact and form a seal with the backside of the substrate 52. The vacuum is then generated between the vacuum cup and the backside of the substrate. The alignment of the contact cup 50 with the backside of the substrate, in turn, enables for the generation of a good vacuum seal to be created behind the backside of the substrate 52 and the contact cup 50. Once the contact cup 50 is vacuum chucked to the substrate 52, the substrate 52 may be reliably lifted, moved and/or inverted.

Figure 9:
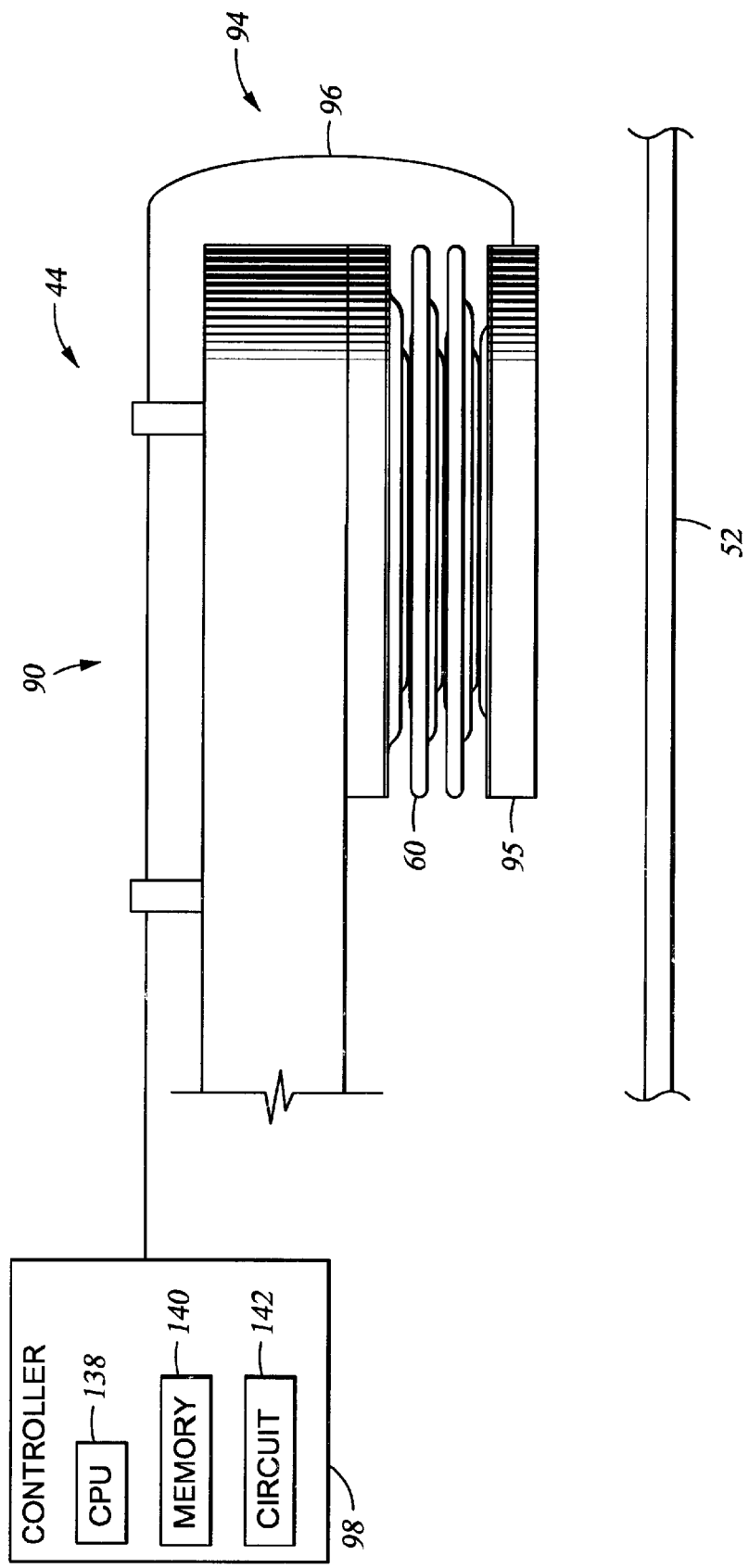
FIG. 9 is a side view of one embodiment of a blade illustrating a bellows flexibly attaching a paddle to a contact cup that is configured for electrostatic chucking.

Proper alignment between the contact cup 50 and the substrate 52 may also be useful in securing a substrate 52 to a contact cup 50 in processing systems that do not utilize vacuum chucking as a method of securing the substrate 52 to the contact cup 50. Examples of such alternative systems include, but are not limited to those systems in which electrostatic force is used to secure the substrate 52 to the contact cup 50. One embodiment of electrostatic force chucking device 90 is shown in FIG. 9. The electrostatic force coupling device comprises blade 44, bellows 60, coupling structure 94, electrostatic contact surface 95, electrical conductor 96, and controller 98. The coupling structure 94 secures the bellows 60 to the blade 44 and is made of such a material as a plastic, elastomeric, adhesive, or metal. The electrical conductor 96 is electrically connected between the controller 98 and the coupling structure 94.

The controller 98 controls the actuation of the mainframe transfer robot 22 and the application of electricity via the electrical conductor 96 to the coupling structure 94 in the embodiment shown in FIG. 9. The controller 98 also controls the operation of the vacuum source 56 in the embodiment shown in FIG. 4. The controller 98 contains a microprocessor 138 (CPU), a memory 140 for storing the control routines, and support circuits 142, such as power supplies, clock circuits, cache and the like. The controller 98 also contains input/output peripherals 144(not shown) such as a keyboard, mouse, and display. The controller 98 is a general-purpose computer that is programmed to perform the sequencing and scheduling operations that facilitate substrate processing and transport. The software routines that control the cluster tool are stored in memory 140 and executed by the microprocessor 138 to facilitate control of the electrostatic chucking of the substrate.

The bellows 60 enable the coupling structure 94 to tilt relative to the substrate 52. This tilting of the coupling structure permits a more precise alignment of the coupling structure 94 with the substrate 52, thereby resulting in more positive chucking. Under certain circumstances the bellows 60 permit the coupling structure to align sufficiently to provide coupling with the substrate 52.

While foregoing is directed to the preferred embodiment of the present invention, other and further embodiments of the invention may be devised without departing from the basic scope thereof, and the scope thereof is determined by the claims that follow.

What is claimed is:

1. A robot blade for a semiconductor processing system, comprising:
    an elongated blade member having a first pivotally mounted end and a second distally extending end, the second distally extending end having a centrally located vacuum aperture formed therein;
    an extendable bellows member sealably attached at a first end to the second distally extending end, such that an interior of the extendable bellows member is annularly positioned around the centrally located vacuum aperture; and
    a rigid substrate engaging cup sealably attached to a second end of the extendable bellows member.

2. The robot blade of claim 1, wherein the elongated blade member comprises:
    a base member; and
    a paddle member longitudinally extending from the base member, the paddle member having a vacuum channel formed therein that is in fluid communication with the centrally located vacuum aperture and a vacuum source.

3. The robot blade of claim 1, wherein the paddle member is rotatably mounted to with the base member and is configured to be rotated through at least 180° via an inversion mechanism.

4. The robot blade of claim 3, wherein the base member is rotatably mounted to a support member.

5. The robot blade of claim 1, wherein extendable bellows member comprises a connecting member positioned about a periphery of the first end and sealably engaging the second distally extending end of the elongated blade member.

6. The robot blade of claim 1, wherein the extendable bellows member is manufactured from at least one of stainless steel, plastic, and inconel.

7. The robot blade of claim 1, wherein the substrate engaging cup comprises an annularly shaped member having a bellows engaging surface and a rigid substrate engaging surface.

8. The robot blade of claim 7, wherein the substrate engaging cup is manufactured from at least one of a metal, a static dissipative phenolic material, an elastomeric material, and a static dissipative ceramic material.

9. The robot blade of claim 8, wherein the metal comprises at least one of stainless steel and plated aluminum.

10. A substrate transfer robot for a semiconductor processing system, comprising:
    a robot arm member having a base end and a distally extending end, the base end being rotatably affixed to a rotatably mounted base member, such that the robot arm member is rotatable about a longitudinally extending axis and a vertical axis that is orthogonal to the longitudinally extending axis; and
    a substrate engaging assembly, comprising:
        an annularly shaped extendable bellows member attached at a periphery of a base end to a central portion of the distally extending end of the robot arm member, the periphery of the bellows member circumscribing a vacuum aperture formed into the central portion of the distally extending end; and
        an annularly shaped rigid substrate engaging cup member sealably attached to an extending end of the extendable bellows member.

11. The substrate transfer robot of claim 10, wherein the robot arm member includes a vacuum channel formed thereon, the vacuum channel being in fluid communication with a vacuum source and the vacuum aperture.

12. The substrate transfer robot of claim 11, wherein the vacuum aperture is configured to generate a region of reduced pressure within an interior portion of the extendable bellows member sufficient to secure a substrate to the substrate engaging cup member.

13. The substrate transfer robot of claim 10, wherein the substrate engaging cup member includes a substrate engaging surface configured to engage and secure a substrate thereto.

14. The substrate transfer robot of claim 10, wherein the robot arm member is rotatable about the longitudinally extending axis via an inversion mechanism.

15. The substrate transfer robot of claim 10, wherein the substrate engaging cup member is manufactured from at least one of a static dissipative phenolic material, an elastomeric material, a static dissipative ceramic material, stainless steel, and plated aluminum.

16. The substrate transfer robot of claim 10, wherein the substrate engaging cup member is sealably attached to the extending end of the extendable bellows member and the base end is sealably attached at the periphery to the distally extending end of the robot arm to cooperatively form a sealable interior region when a substrate is engaged by the substrate engaging cup member.

17. The substrate transfer robot of claim 10, wherein the robot arm is configured to engage a substrate at a first location, rotate to a second location, invert the substrate, and deposit the substrate in the inverted orientation at the second location.

18. A method for transporting semiconductor substrates in a semiconductor processing system, comprising:

extending a rigid substrate engaging cup member positioned in a central portion of a distal end of a robot arm member with a selectively extendable annularly shaped bellows member; sealably contacting a semiconductor substrate with the substrate engaging cup member;

generating a region of negative pressure proximate the substrate engaging cup member, the region of negative pressure operating the secure the substrate to the substrate engaging cup member;

inverting the substrate via rotation of the robot arm member; and releasing the negative pressure proximate the substrate engaging cup member to disengage the substrate from the substrate engaging cup member.

19. The method for transporting semiconductor substrates recited in claim 18, wherein sealably contacting the semiconductor substrate with the substrate engaging cup member comprises sealably positioning a substantially planar substrate engaging surface of the substrate engaging cup member on the substantially planar surface of the semiconductor substrate.

20. The method for transporting semiconductor substrates recited in claim 18, wherein generating the region of negative pressure comprises communicating a vacuum source with a vacuum aperture positioned in a central portion of the distal end of the robot arm member, the vacuum aperture being concentrically positioned within the annularly shaped bellows member.

21. The method for transporting semiconductor substrates recited in claim 18, wherein inverting the substrate via rotation of the robot arm member comprises rotating the robot arm member about a longitudinal axis with an inversion mechanism.

22. The method for transporting semiconductor substrates recited in claim 18, wherein the method includes transferring a substrate between a first processing chamber where the substrate is in a first orientation, to a second processing chamber where the substrate is to be positioned in a second orientation, wherein the second orientation is inverted 180° from the first orientation.

* * * * *

UNITED STATES PATENT AND TRADEMARK OFFICE
CERTIFICATE OF CORRECTION

PATENT NO. : 6,413,037 B1
DATED : July 2, 2002
INVENTOR(S) : Jeffrey A. Brodine

It is certified that error appears in the above-identified patent and that said Letters Patent is hereby corrected as shown below:

Column 2,
Line 28, please change "contact cup is flexibly" to -- contact cup which is flexibly --.
Line 30, please change "allow" to -- allows --.
Line 36, please delete the comma after "provided" and add -- is -- in front of "flexibly".
Line 42, please change "sup" to -- cup --.

Column 5,
Line 52, please delete "to" after "applied".

Column 6,
Line 11, please change "is as elastomeric" to -- is an elastomeric --.
Line 45, please add -- in a -- before "compressed".
Line 65, please move "such" to appear after "material".

Column 7,
Line 5, please delete "for" after "enables".
Line 23, please delete "a" before "plastic".

Column 9,
Line 27, please change "operating the secure" to -- operating to secure --.

Signed and Sealed this

Seventeenth Day of December, 2002

JAMES E. ROGAN
*Director of the United States Patent and Trademark Office*